United States Patent
Takamizawa

(10) Patent No.: US 9,581,801 B2
(45) Date of Patent: Feb. 28, 2017

(54) MICROSCOPE SYSTEM

(71) Applicant: OLYMPUS CORPORATION, Shibuya-ku, Tokyo (JP)

(72) Inventor: Nobuhiro Takamizawa, Sagamihara (JP)

(73) Assignee: OLYMPUS CORPORATION, Tokyo (JP)

( * ) Notice: Subject to any disclaimer, the term of this patent is extended or adjusted under 35 U.S.C. 154(b) by 302 days.

(21) Appl. No.: 14/273,235

(22) Filed: May 8, 2014

(65) Prior Publication Data

US 2014/0340504 A1    Nov. 20, 2014

(30) Foreign Application Priority Data

May 17, 2013    (JP) .................................. 2013-105000

(51) Int. Cl.
H04N 7/18       (2006.01)
G02B 21/36      (2006.01)
(Continued)

(52) U.S. Cl.
CPC ......... *G02B 21/365* (2013.01); *G02B 21/0076* (2013.01); *G02B 21/06* (2013.01);
(Continued)

(58) Field of Classification Search
CPC ....... G02B 21/365; G02B 21/06; G02B 21/26; G02B 21/24; H04N 5/2256; H04N 5/23229; H01J 37/28
See application file for complete search history.

(56) References Cited

U.S. PATENT DOCUMENTS 5,473,706 A * 12/1995 Bacus .............. G01N 35/00029
                                                              356/39
6,717,723 B2    4/2004 Arai
(Continued)

FOREIGN PATENT DOCUMENTS

JP      2001124698 A    5/2001
JP      2002-131645 A   5/2002
(Continued)

OTHER PUBLICATIONS

Extended European Search Report dated Jun. 27, 2014 in counterpart European Application No. 14167156.0.
(Continued)

*Primary Examiner* — Shawn An
(74) *Attorney, Agent, or Firm* — Holtz, Holtz & Volek PC

(57) ABSTRACT

A microscope system including: an observation optical system acquiring an image of an observation position of a sample; a stimulation optical system irradiating the sample with stimulation light; an observation position setting section setting the observation positions; a stimulation position setting section setting a common stimulation position; a stage switching the observation positions; a synchronization condition setting section setting a common synchronization condition in which the timing of the image acquisition is associated with the timing of the irradiation with stimulation light; an observation condition registration section registering the common stimulation position and the common synchronization condition as observation conditions associated with each of the observation positions; and a control section, according to the registered conditions, switching the observation positions, making the observation optical system acquire an image of each of the observation positions, and making the stimulation optical system irradiate each of the stimulation positions with stimulation light.

9 Claims, 11 Drawing Sheets

(51) Int. Cl.
*G02B 21/24* (2006.01)
*G02B 21/00* (2006.01)
*G02B 21/32* (2006.01)
*G02B 21/06* (2006.01)
*G02B 21/26* (2006.01)
*H04N 5/225* (2006.01)
*H04N 5/232* (2006.01)
*H01J 37/28* (2006.01)

(52) U.S. Cl.
CPC ............ *G02B 21/24* (2013.01); *G02B 21/26* (2013.01); *G02B 21/32* (2013.01); *H04N 5/2256* (2013.01); *H04N 5/23229* (2013.01); *H01J 37/28* (2013.01)

(56) References Cited

U.S. PATENT DOCUMENTS

| | | | |
|---|---|---|---|
| 6,781,751 B2 | 8/2004 | Arai | |
| 2007/0262264 A1* | 11/2007 | Hasegawa | G01N 21/6408 250/458.1 |
| 2007/0269796 A1 | 11/2007 | Nakano et al. | |
| 2010/0208052 A1* | 8/2010 | Sase | G02B 21/367 348/79 |
| 2011/0122489 A1* | 5/2011 | Matsuo | G02B 21/0048 359/385 |
| 2011/0127405 A1 | 6/2011 | Grossman et al. | |
| 2012/0001069 A1* | 1/2012 | Kashihara | G02B 21/0004 250/310 |

FOREIGN PATENT DOCUMENTS

| | | |
|---|---|---|
| JP | 2006220818 A | 8/2006 |
| JP | 2007309776 A | 11/2007 |
| JP | 2012014066 A | 1/2012 |

OTHER PUBLICATIONS

Kumar, et al., "FLIM FRET Technology for Drug Discovery: Automated Multiwell-Plate High-Content Analysis, Multiplexed Readouts and Application in Situ", ChemPhysChem, vol. 12, No. 3, Feb. 25, 2011, pp. 609-626, XP055062874.

Japanese Office Action dated Oct. 25, 2016 issued in counterpart Japanese Application No. 2013-105000.

* cited by examiner

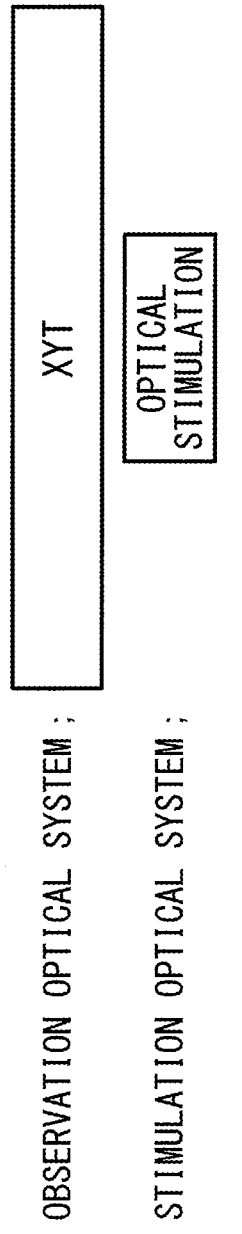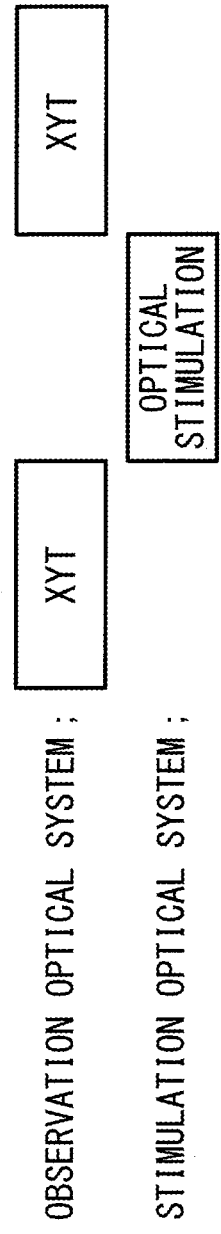
FIG. 2 (a)
FIG. 2 (b)

MICROSCOPE SYSTEM

CROSS REFERENCE TO RELATED APPLICATIONS

This application is based on Japanese Patent Application No. 2013-105000, the contents of which are incorporated herein by reference.

TECHNICAL FIELD

The present invention relates to a microscope system.

BACKGROUND ART

Conventionally, experiments of FRET (Fluorescence resonance energy transfer) and FRAP (Fluorescence Recovery After Photo-bleaching), and the like, have been known as methods for analyzing molecular interactions such as combination and separation of molecules or aggregation and diffusion of molecules. In the experiments of FRET and FRAP, it is required that acquisition of an image of an observation object, and optical stimulation of the observation object are synchronized with each other at a high speed and with a high accuracy. A scanning laser microscope for performing such experiments is known (see, for example, Patent Literature 1).

The scanning laser microscope described in Patent Literature 1 is configured to perform the experiment of FRET or FRAP in such a manner that an observation position, and the output power of laser light radiated to the observation position, and also a stimulation position, and the output power of laser light radiated to the stimulation position are registered in a system, and that the observation and optical stimulation of a sample are performed on the basis of the registered observation and stimulation positions, and on the basis of the registered output power of the laser light corresponding to each of the registered observation and stimulation positions.

CITATION LIST

Patent Literature

{PTL 1}
Japanese Unexamined Patent Application, Publication No.

SUMMARY OF INVENTION

Solution to Problem

A first aspect of the present invention is a microscope system including: an observation optical system that acquires image information at an observation position of a sample; a stimulation optical system that irradiates the sample with stimulation light; an observation position setting section that sets a plurality of the observation positions; a stimulation position setting section that sets a common stimulation position which is irradiated with stimulation light in association with the observation position; an observation position switching section that switches the plurality of the observation positions set by the observation position setting section; a synchronization condition setting section that sets a common synchronization condition in which the timing of acquisition of image information by the observation optical system is associated with the timing of irradiation with the stimulation light by the stimulation optical system; an observation condition registration section that registers the common stimulation position and the common synchronization condition as observation conditions associated with each of the plurality of the observation positions; and a control section that, according to the observation conditions registered in the observation condition registration section, makes the observation position switching section switch the observation positions, makes the observation optical system acquire image information of each of the observation positions, and makes the stimulation optical system irradiate each of the stimulation positions with stimulation light.

BRIEF DESCRIPTION OF DRAWINGS

FIG. 2(a) is a view showing a pattern which is a synchronization condition, and in which optical stimulation is performed by a stimulation optical system while an image is acquired by an observation optical system, and FIG. 2(b) is a view showing a pattern which is a synchronization condition, and in which the image acquisition is performed by the observation optical system before and after the optical stimulation in terms of time.

DESCRIPTION OF EMBODIMENTS

First Embodiment

A microscope system according to a first embodiment of the present invention will be described below with reference to the accompanying drawings.

Figure 1:
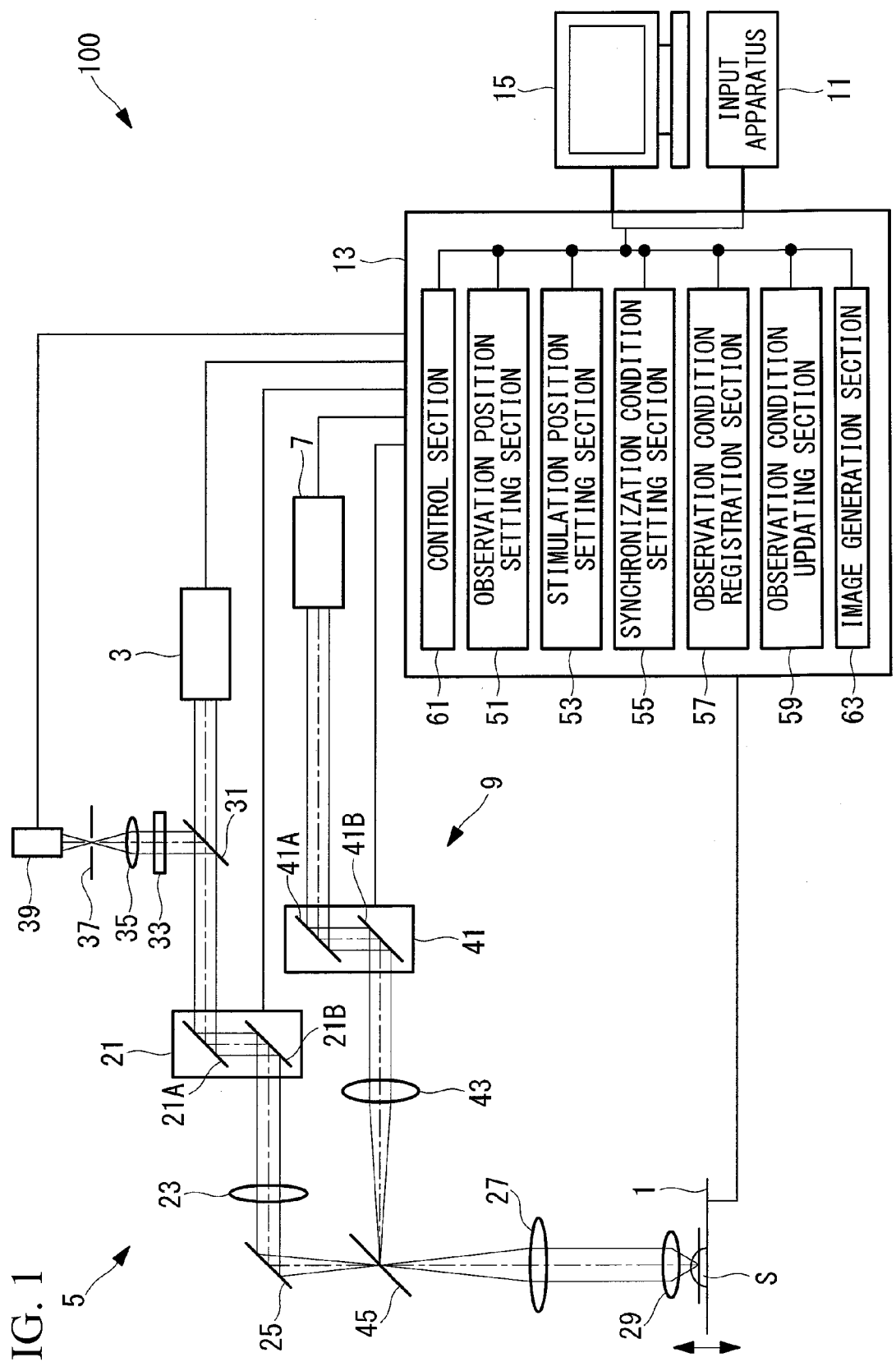
FIG. 1 is a view showing a schematic configuration of a microscope system according to a first embodiment of the present invention.

As shown in FIG. 1, a microscope system 100 according to the present embodiment includes a stage (observation position switching section) 1 on which a sample S is mounted, an observation light source 3 which generates illumination light (laser light), an observation optical system 5 which irradiates the sample S with the illumination light emitted from the observation light source 3 and acquires image information at an observation position of the sample S, a stimulation light source 7 which generates stimulation light (laser light), a stimulation optical system 9 which irradiates sample S in an observation range with the stimulation light emitted from the stimulation light source 7, an input apparatus 11 into which an instruction from a user is inputted, a PC (Personal Computer) 13 which is connected to the observation optical system 5, the stimulation optical system 9, and the like, to control these systems, and a monitor 15 which displays the image of the sample S, and the like.

The stage 1 is provided so as to be movable in the XY directions perpendicular to the optical axes of the illumination light and the stimulation light radiated to the sample S. The microscope system 100 is configured such that the observation position of the observation optical system 5 can be switched by moving the stage 1 to move the sample S in the XY directions with respect to the illumination light.

The observation optical system 5 includes a scanning optical unit (Main Scanner) 21 which scans, on the sample S, the illumination light emitted from the observation light source 3, a relay lens 23 which relays the illumination light passing through the scanning optical unit 21, a reflection mirror 25 which reflects the illumination light relayed by the relay lens 23, an imaging lens 27 which converts, into parallel light, the illumination light reflected by the reflection mirror 25, and an objective lens 29 which irradiates the sample S with the illumination light converted into the parallel light by the imaging lens 27 and also condenses return light including fluorescent light which is generated in the sample S when the sample S is irradiated with the illumination light.

The scanning optical unit 21 includes a Y direction scanner 21A and an X direction scanner 21B which are provided so as to be rockable about the rocking axes perpendicular to each other. These scanners 21A and 21B are configured such that the illumination light made incident from the observation light source 3 can be two-dimensionally scanned on the sample S by being deflected in the two directions perpendicular to each other. Further, the scanning optical unit 21 is configured to send the scanning position information, representing the scanning position of the illumination light, to the PC 13 on the basis of the rocking angle of each of the scanners 21A and 21B.

The objective lens 29 is attached to a revolver (not shown), and is configured to be able to be replaced by the other objective lens having a different magnification by the revolver.

Further, the observation optical system 5 includes a dichroic mirror 31 by which the return light condensed by the objective lens 29 and returning the optical path of the laser light is branched from the optical path of the laser light, a photometry filter 33 which selectively transmits only light having a fluorescent wavelength and included in the return light branched by the dichroic mirror 31, a condenser lens 35 which condenses the fluorescent light passing through the photometry filter 33, a pinhole 37 which restricts the passage of the fluorescent light condensed by the condenser lens 35, and a photoelectric conversion element 39 which detects the fluorescent light passing through the pinhole 37.

The dichroic mirror 31 is arranged between the observation light source 3 and the scanning optical unit 21, and is configured to transmit the illumination light from the observation light source 3 and also to reflect, to the photometry filter 33, the return light returning via the scanning optical unit 21.

The pinhole 37 is configured so as to transmit only the fluorescent light generated from the focus position of the illumination light in the sample S. The photoelectric conversion element 39 is configured to convert the detected fluorescent light into a luminance signal (image information) corresponding to the luminance of the detected fluorescent light, and is configured to send the luminance signal to the PC 13.

The stimulation optical system 9 includes a scanning optical unit (SIM Scanner) 41 which scans, on the sample S, the stimulation light emitted from the stimulation light source 7, a relay lens 43 which relays the stimulation light passing through the scanning optical unit 41, and a dichroic mirror 45 which combines the optical path of the stimulation light transmitted through the relay lens 43 with the optical path of the illumination light of the observation optical system 5.

The scanning optical unit 41 includes a Y direction scanner 41A and an X direction scanner 41B which are provided so as to be rockable respectively about rocking axes perpendicular to each other, and is configured to scan the stimulation light incident from the stimulation light source 7 two-dimensionally on the sample S by deflecting the stimulation light in the two directions perpendicular to each other.

The dichroic mirror 45 is arranged at the optical path of the illumination light between the reflection mirror 25 and the imaging lens 27. The dichroic mirror 45 is configured to reflect, to the imaging lens 27, the stimulation light transmitted through the relay lens 43 of the stimulation optical system 9 and is also configured to transmit the illumination light from the reflection mirror 25 and the return light from the imaging lens 27.

The input apparatus 11 is configured by, for example, a keyboard, a mouse (pointing device), a GUI (Graphical User Interface), (each of which is not shown) and the like. It is configured such that, by operation of the mouse, or the like, of the input apparatus 11, the user can input a desired observation position and a desired stimulation position on the image displayed on the monitor 15. Each of the observation position and the stimulation position may be a point having almost no area or a region having an area.

The PC 13 includes an observation position setting section 51 that sets a position of observation performed by the observation optical system 5, a stimulation position setting section 53 that sets a stimulation position which is irradiated with stimulation light by the stimulation optical system 9, a synchronization condition setting section 55 that sets a common synchronization condition in which the timing of image information acquisition by the observation optical system 5 is associated with the timing of irradiation with stimulation light by the stimulation optical system 9, an observation condition registration section 57 that registers a predetermined observation condition by associating a predetermined observation condition with an observation position set by the observation position setting section 51, an observation condition updating section 59 that updates, for each of the observation positions, the observation condition registered by the observation condition registration section 57, a control section 61 that controls the movement of the stage 1, the image acquisition by the observation optical system 5, the optical stimulation by the stimulation optical system 9, and the like, and an image generation section 63 that generates an image of the sample S.

The observation position setting section 51 is configured to set an observation position inputted by the input apparatus 11.

The stimulation position setting section 53 is configured to set a stimulation position inputted by the input apparatus 11.

Figure 9:
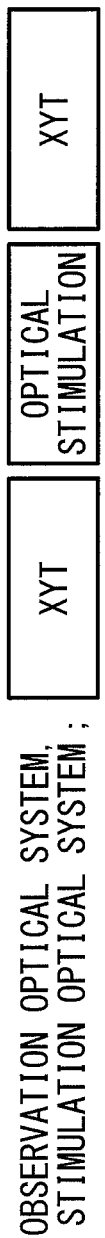
FIG. 9 is a pattern which is a synchronization condition, and in which image acquisition, optical stimulation, and image acquisition are performed in order by the same scanning optical system.

The synchronization condition setting section 55 is configured to set following patterns as synchronization conditions. For example, as shown in FIG. 2(*a*), the first pattern is set so that, while several frames of XYT images, which are a bundle of a plurality of XY images continuous in time, are acquired from the observation optical system 5, a sample is irradiated with stimulation light (optically stimulated) by the stimulation optical system 9 during the acquisition of the frames. Further, as shown in FIG. 2(*b*), the second pattern is set so that, when a plurality of frames of XYT images are acquired by the observation optical system 5, the image acquisition is temporarily interrupted, and the sample S is irradiated with stimulation light (optically stimulated) by the stimulation optical system 9, and thereafter a plurality of frames of XYT images are acquired again by the observation optical system 5. Each of FIG. 2(*a*) and FIG. 2(*b*) is a view which shows the operation timings of the observation optical system 5 and the stimulation optical system 9, and in which the horizontal axis represents time. FIG. 9 is also a view similarly showing the operation timings of the observation optical system 5 and the stimulation optical system 9.

The observation condition registration section 57 is configured to set, as predetermined observation conditions, a common stimulation position set by the stimulation position setting section 53, and a common synchronization condition set by the synchronization condition setting section 55, in addition to the conditions, such as, the wavelength and intensity of illumination light generated by the observation light source 3, the wave length, sensitivity and gain of the photoelectric conversion element 39, the scanning speed of the scanning optical unit 21, the size of an image generated by the image generation section 63, the wavelength and intensity of stimulation light generated by the stimulation light source 7, and the irradiation time in which a stimulation position is irradiated with stimulation light.

The observation condition updating section 59 is configured to adjust, according to a user's instruction, the common stimulation position associated with each of the observation positions, to make the common stimulation position have a size (area), a shape and a position for each of the observation positions, and is configured to update the observation condition for each of the observation positions on the basis of each of the adjusted stimulation positions.

The control section 61 is configured to move the stage 1 in the XY directions, so as to switch the observation position to be observed by the observation optical system 5. Further, the control section 61 is configured, according to the observation condition for each of the observation positions updated by the observation condition updating section 59, to make the observation optical system 5 acquire image information at each of the observation positions, and to make the stimulation optical system 9 irradiate each of the stimulation positions with stimulation light. Further, the control section 61 is configured to make the monitor 15 display the information on the common stimulation position and the common synchronization condition which are registered in the observation condition registration section 57.

The image generation section 63 is configured to receive the luminance signal sent from the photoelectric conversion element 39, and the scanning position information sent from the scanning optical unit 21 in a state in which the luminance signal and the scanning position information are associated with each other. Further, the image generation section 63 is configured to generate a two-dimensional image at the observation position by integrating the luminance signals for respective pixels corresponding to the scanning position information.

The operation of the microscope system 100 configured in this way will be described.

In order to acquire an image of the sample S by the microscope system 100 according to the present embodiment, the sample S is first mounted on the stage 1, and illumination light is generated by the observation light source 3.

The illumination light emitted from the observation light source 3 is transmitted through the dichroic mirror 31, so as to be scanned by the scanning optical unit 21, and is relayed by the relay lens 23, so as to be reflected by the reflection mirror 25. Then, the illumination light is transmitted through the dichroic mirror 45 and is applied to the sample S by the objective lens 29 via the imaging lens 27.

When fluorescent light is generated in the sample S by the irradiation with the illumination light, return light including the fluorescent light is condensed by the objective lens 29 and is transmitted through the imaging lens 27 and the dichroic mirror 45. Then, the return light is reflected by the reflection mirror 25 and relayed by the relay lens 23, so as to be returned through the optical path of the illumination light via the scanning optical unit 21.

Further, the return light is reflected by the dichroic mirror 31 to be branched from the optical path of the illumination light, and the fluorescent light is extracted by removing light other than the fluorescent light from the return light by the photometry filter 33, so as to be condensed by the condenser lens 35. Only the fluorescent light, which is included in the fluorescent light condensed by the condenser lens 35 and which is generated from the focus position of the illumination light in the sample S, is made to pass through the pinhole 37, so as to be detected by the photoelectric conversion element 39. A luminance signal corresponding to the luminance of the fluorescent light detected by the photoelectric conversion element 39 is sent to the image generation section 63.

The luminance signal sent from the photoelectric conversion element 39 is integrated, by the image generation section 63, for each of the pixels corresponding to the scanning position information from the scanning optical unit 21, so that a two-dimensional image of the sample is generated. The image of the sample S, generated by the image generation section 63, is displayed on the monitor 15. Thereby, the user can observe the sample S by looking at the image displayed on the monitor 15.

Next, when the sample S is stimulated by the microscope system 100, laser light is generated by the stimulation light source 7. The stimulation light emitted from the stimulation light source 7 is scanned by the scanning optical unit 41, so as to be relayed by the relay lens 43 and reflected by the dichroic mirror 45, and is then applied to the sample S by the objective lens 29 via the imaging lens 27. Thereby, it is possible to optically stimulate the sample S with the stimulation light at the irradiation position.

Next, there will be described a case where an experiment of FRET (Fluorescence resonance energy transfer), FRAP (Fluorescence Recovery After Photo-bleaching), or the like, is performed to a plurality of samples S, such as, for example, cells cultured in each of wells of a multi-well plate (not shown).

Figure 3:
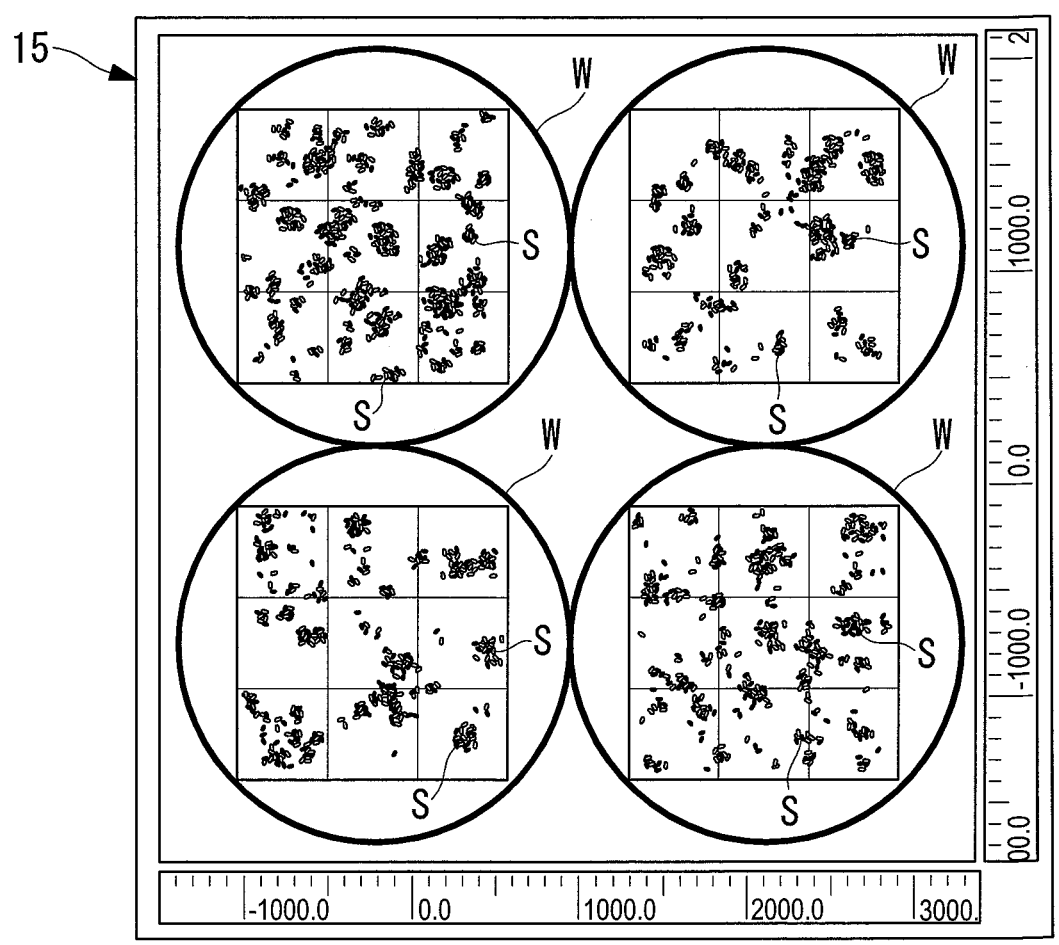
FIG. 3 is a view showing an image of an entire well having a plurality of samples.

First, the user acquires an image of the entire wells by setting an objective lens 29 of low magnification or by lowering optical zoom magnification, and makes the image of the entire wells displayed on the monitor 15 as shown in FIG. 3. FIG. 3 shows an image including four wells W.

Figure 4:
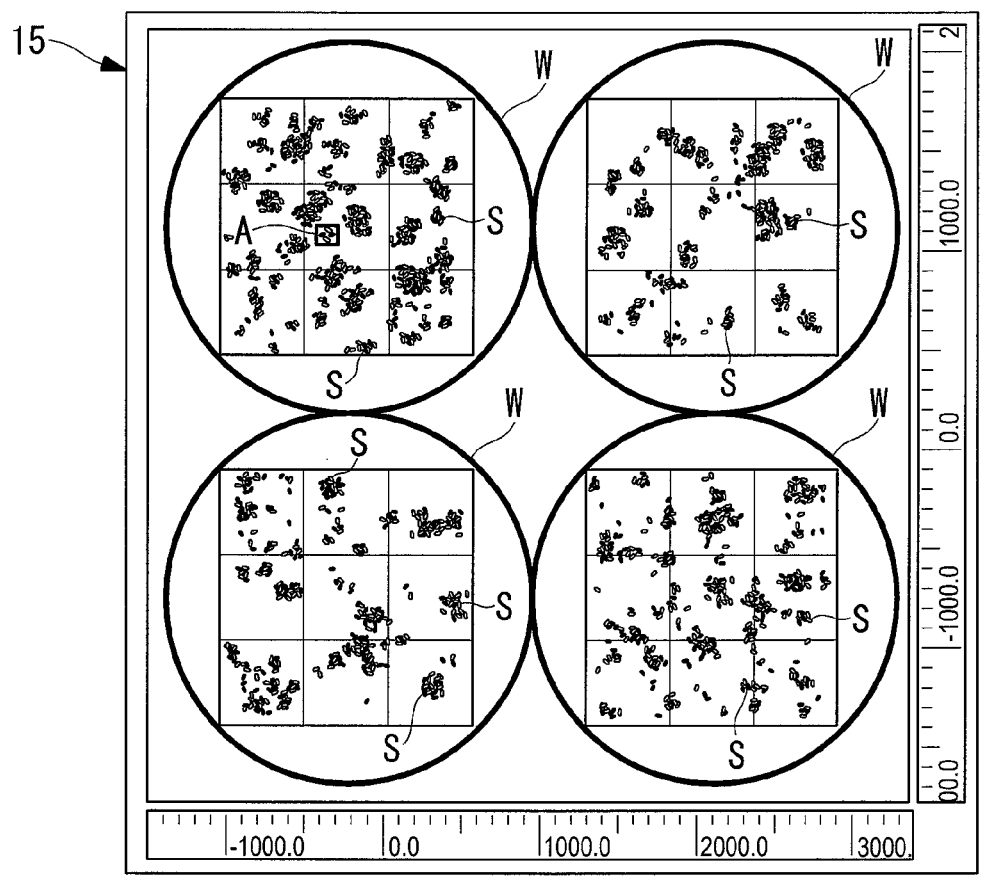
FIG. 4 is a view showing a state in which an observation position serving as a reference is inputted in an image of the entire well.

Next, the user sets a high magnification objective lens 29 or increases the optical zoom magnification. Then, by using the input apparatus 11, the user inputs, in the image of the entire wells as shown in FIG. 4, an observation position A (reference observation position A) serving as a reference for performing the experiment of FRET or FRAP. The reference observation position A inputted by the user is set by the observation position setting section 51. Then, the user acquires an image at the reference observation position A, and makes the acquired image at the reference observation position A displayed on the monitor 15.

Figure 5:
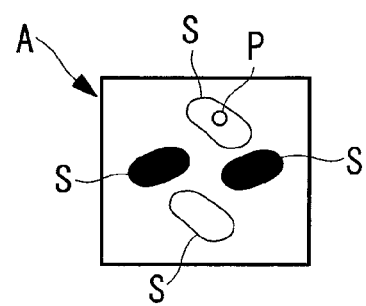
FIG. 5 is a view showing a state in which a stimulation position to be stimulated is inputted on the image of the sample in the reference observation position.

Next, as shown in FIG. 5, the user inputs, by the input apparatus 11, a stimulation position P which is desired to be stimulated and which is located on the sample S included in the image of the reference observation position A displayed on the monitor. The stimulation position P inputted by the user is set by the stimulation position setting section 53. The stimulation position P (a small circle in FIG. 5) may be a region having a predetermined area or only a single point.

Next, by the synchronization condition setting section 55, the user sets a common synchronization condition which is expected in the experiment of FRET or FRAP, and in which the timing of acquisition of image information is associated with the timing of irradiation with stimulation light. For example, the user sets the synchronization condition of the first pattern as shown in FIG. 2(a), or the synchronization condition of the second pattern as shown in FIG. 2(b).

Figure 6:
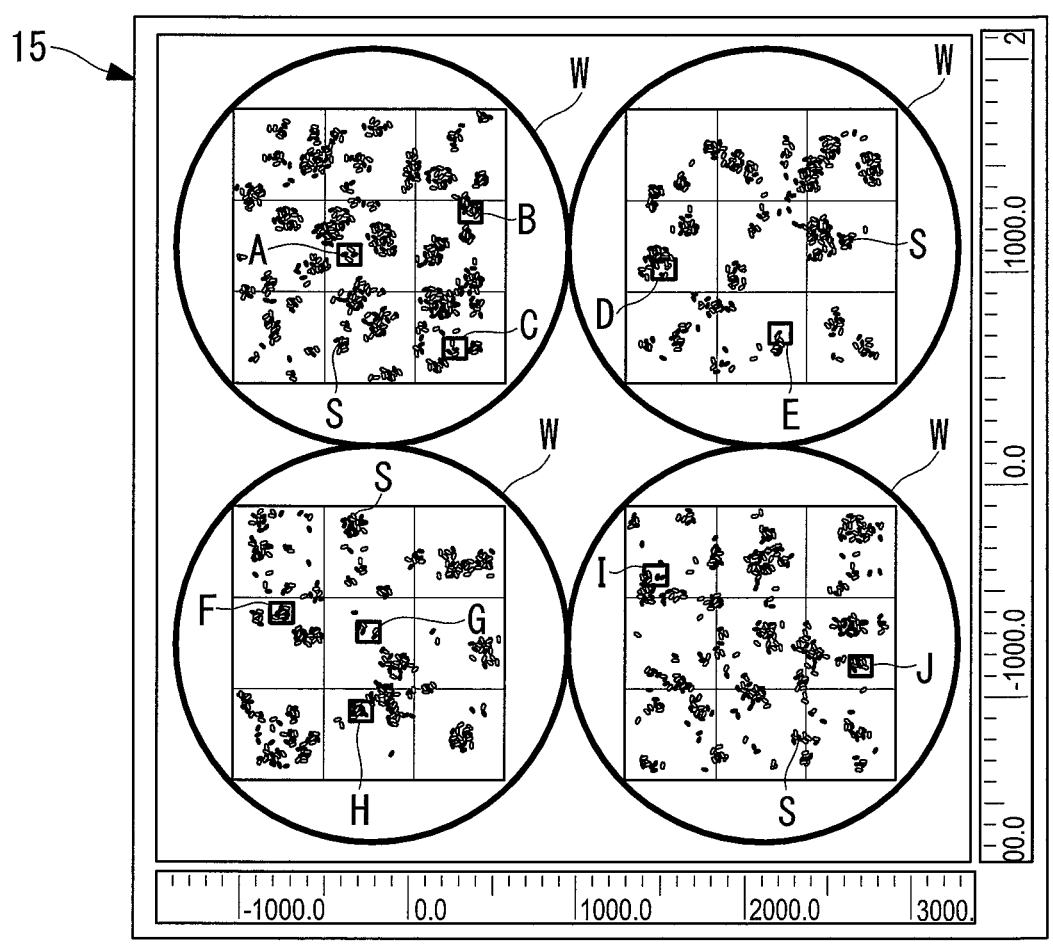
FIG. 6 is a view showing a state in which all of observation positions are inputted in the images of the entire well.

Next, as shown in FIG. 6, the user inputs, by the input apparatus 11, the other observation positions (observation positions B to J in the example shown in FIG. 6) which are included in the image of the entire wells and at which the experiment of FRET or FRAP is performed. The other observation positions B to J inputted by the user are set by the observation position setting section 51.

When all the observation positions A to J are set by the observation position setting section 51, the observation conditions including the common stimulation position P set by the stimulation position setting section 53, the common synchronization condition set by the synchronization condition setting section 55 and the other conditions, such as the wavelength and intensity of illumination light, are registered by the observation condition registration section 57 so as to correspond to each of the observation positions A to J.

Here, the arrangement of the sample S is different for each of the observation positions A to J, and hence the sample S does not necessarily exist at the common stimulation position P associated with each of the other observation positions B to J other than the reference observation position A. Therefore, by using the input apparatus 11, the user selects, one by one, each of the other observation positions B to J registered in the observation condition registration section 57, and obtains the image of the other selected observation position B (C to J), so as to make the acquired image displayed on the monitor 15. At this time, the registered information on the common stimulation position and the common synchronization condition is also displayed on the monitor 15 by the control section 61. For example, the common stimulation position is displayed, in a superimposed manner, on each of the acquired images of the other observation positions.

Then, in correspondence with the sample S included in the selected observation position B (C to J), the user individually adjusts, by using the input apparatus 11, the size, shape and position of the portion which is to be optically stimulated. For example, a stimulation position is set to correspond to the nucleus of a desired cell (sample S) included in the observation position B. Then, the observation condition associated with the observation position B is updated by the observation condition updating section 59 by using the adjusted individual stimulation position.

Similarly to the observation position B, the user acquires an image of each of the remaining observation positions C to J, and adjusts the stimulation position as required. According to the adjustment by the user, the observation condition is updated for each of the observation positions C to J by the observation condition updating section 59.

Thereby, the preparation work is completed.

Subsequently, the experiment of FRAP or FRET is performed by the control section 61. The observation positions A to J and the observation conditions, which are registered in the observation condition registration section 57, are read by the control section 61, and then the stage 1 is moved by the control section 61, so that the first observation position A is arranged in a visual field position. Further, according to the registered observation conditions, the observation optical system 5 and the stimulation optical system 9 are controlled by the control section 61, so that the acquisition of the image and the optical stimulation are performed to the sample S in the observation position A.

That is, XYT images of the observation position A are acquired by the observation optical system 5, and during the acquisition of the XYT images, the stimulation position is irradiated with stimulation light by the stimulation optical system 9, so that the sample S is optically stimulated.

Subsequently, the stage 1 is moved by the control section 61, so that the second observation position B is arranged at the visual field position. Then, by the control section 61, the observation optical system 5 and the stimulation optical system 9 are controlled according to the observation conditions updated in correspondence with the observation position B, and the image acquisition and the optical stimulation are performed to the sample S in the observation position B. Similarly, the image acquisition and optical stimulation of the sample S are performed according to the observation conditions updated individually in correspondence with each of the observation positions C to J.

As described above, with the microscope system 100 according to the present embodiment, it is possible that, after the user performs the preparation work of setting the common stimulation position and the common synchronization condition, the acquisition of image information and the irradiation with stimulation light are automatically performed to each of the observation positions A to J. Therefore, in a state in which the labor of the user is reduced, the same experiment by the observation and optical stimulation can be performed for a plurality of samples S for each of the observation positions A to J. Further, by the observation condition updating section 59, the observation conditions are updated to the observation conditions in which the stimulation position is adjusted individually for each of the observation positions B to J, and thereby a plurality of samples can be highly accurately observed and optically stimulated for each of the observation positions A to J.

Figure 10A:
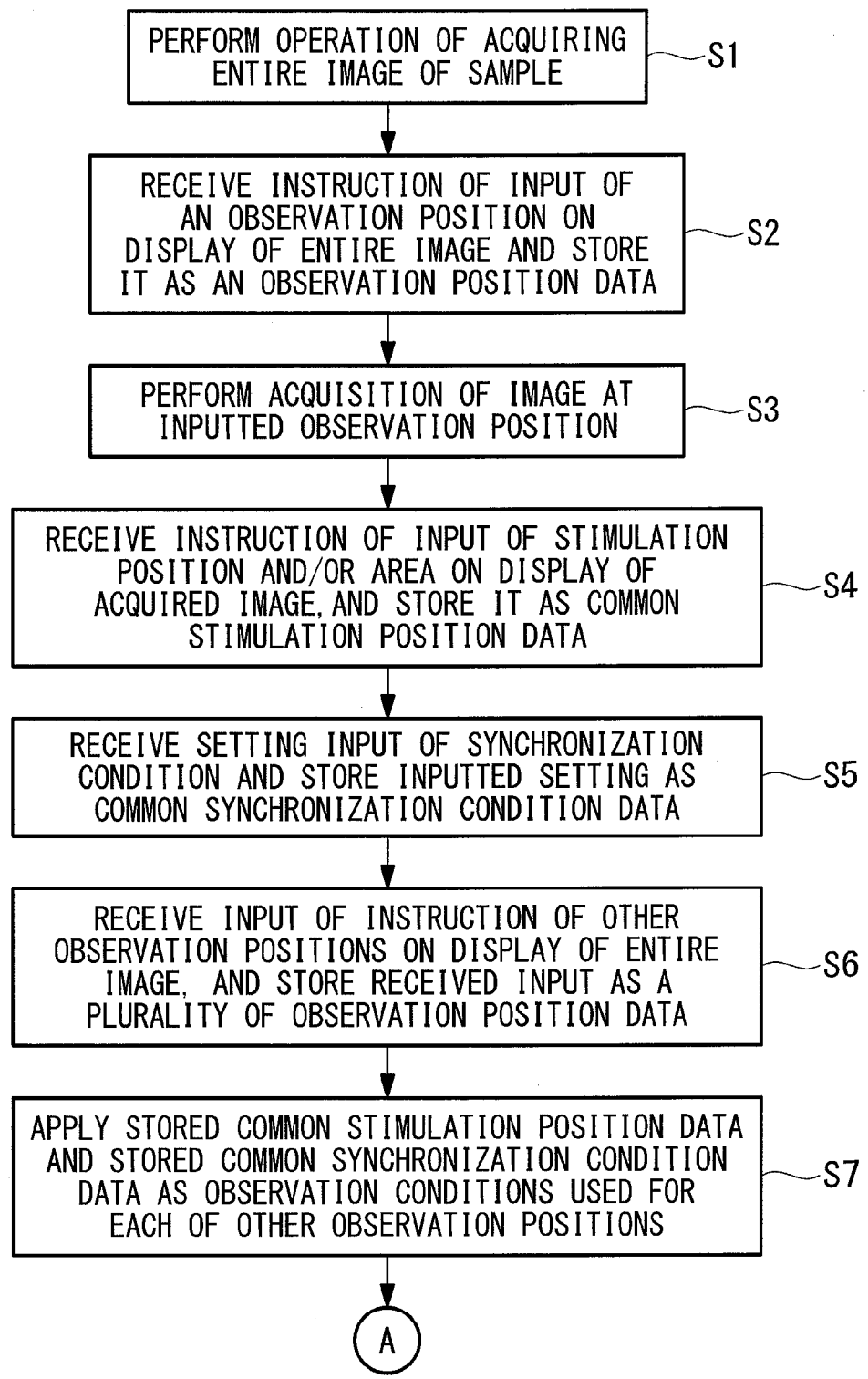
FIGS. 10A and 10B are flow charts for explaining the operation of the PC shown in FIG. 1.
Figure 10B:
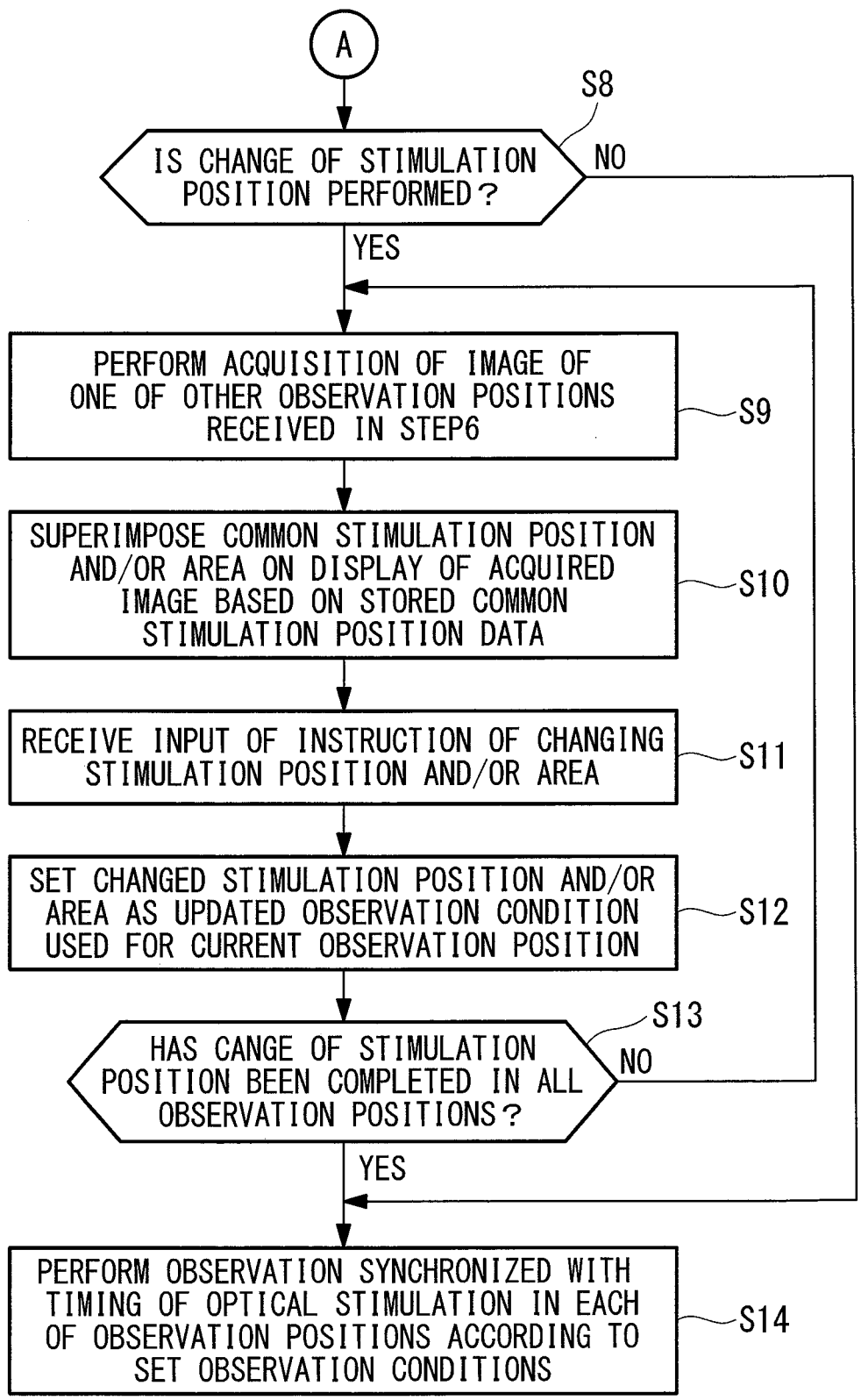

FIGS. 10A and 10B are flow charts showing the operation of the PC 13 in the above-described experiments of FRET or FRAP. Steps 2 and 6 correspond to the actual operation when the PC 13 functions as the observation position setting section. Step 4 corresponds to the actual operation when the PC 13 functions as the stimulation position setting section. In step 4, the common stimulation position data to be stored is, for example, relative position information with respect to the observation position specified in step 2 (the position where the image used for specifying the stimulation position is acquired). Step 5 corresponds to the actual operation when the PC 13 functions as the synchronization condition setting section. Step 7 corresponds to the actual operation when the PC 13 functions as the observation condition registration section. Steps 8 to 13 correspond to the actual operation when the PC 13 functions as the observation condition updating section. Step 14 corresponds to the actual operation when the PC 13 functions as the control section.

The present embodiment can be modified as follows.

For example, the present embodiment is configured to include the observation condition updating section 59. However, as a first modification, it may be configured such that the observation condition updating section is not adopted, and such that the observation position setting section 51 sets each of the observation positions so that the common stimulation position is arranged at a desired position in each of the observation positions.

In this case, for example, it may be configured such that the center of an observation position set by the observation position setting section 51 corresponds to a stimulation position, and such that each of the observation positions A to J is set so that a desired portion of each of samples S, which portion is to be stimulated, is located at the center of each of the observation positions A to J.

In this configuration, at the same time when the plurality of observation positions A to J are set, the stimulation position is arranged at a desired portion of each of the samples S for each of the observation positions A to J, and hence a desired stimulation position can be set at one time for each of the observation positions A to J by the stimulation position setting section 53. Therefore, it is possible that the labor to re-adjust the stimulation positions once set is eliminated, and thereby the experiment by the observation and optical stimulation is performed simply and efficiently for a plurality of the samples S for each of the observation positions.

Further, as a second modification, the following method is also considered as the method for setting the stimulation positions other than the above-described method.

The stimulation position set in the first observation position is not used as the common stimulation position, and for example, the control section 61 sets, by default, a stimulation position at the center of the observation visual field for each of the second and subsequent observation positions, so that the default stimulation position is superimposed on the acquired image of each of the observation positions, which image is displayed on the monitor 15. Further, in order to adjust the default stimulation position in each of the observation positions to a desired position of the sample, upon reception of an input from the user for correction of the stimulation position on the image displayed on the monitor 15, the stimulation position is updated for each of the corrected observation positions by the observation condition updating section 59. Here, the same condition of the size (shape) of the stimulation position set in the first observation position is taken over as the size (shape) of the stimulation position set, by default, in each of the second and subsequent observation positions.

Second Embodiment

Next, a microscope system according to a second embodiment of the present invention will be described.

Figure 7:
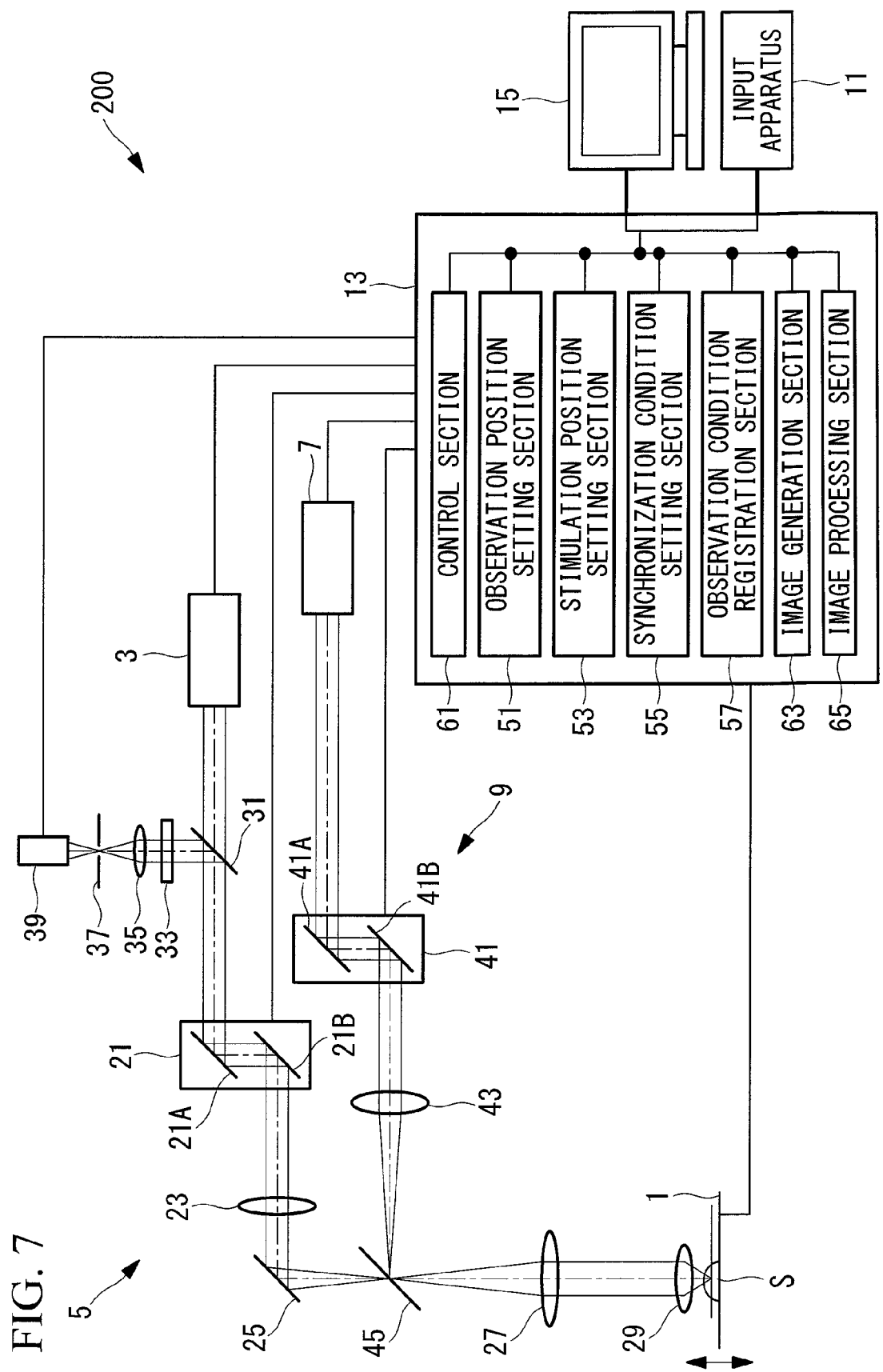
FIG. 7 is a view showing a schematic configuration of a microscope system according to a second embodiment of the present invention.

As shown in FIG. 7, a microscope system 200 according to the present embodiment is different from the first embodiment in that the microscope system 200 includes, instead of the observation condition updating section 59, an image processing section 65 configured to perform processing of the image generated by the image generation section 57, and in that the stimulation position setting section 53 automatically sets a stimulation position on the basis of the image processed by the image processing section 65.

In the following, the portions, which configure the microscope system 200 and which are in common with the portions configuring the microscope system 100 according to the first embodiment, are denoted by the same reference numerals and characters, and the description thereof is omitted.

The image processing section 65 is configured to be able to extract a feature of each of the observation positions by image processing. Examples of the features of the observation position include the nucleus of a cell (sample S). The image processing section 65 is configured to extract, as a feature of each of the observation positions, the nucleus of a specific cell on the basis of a difference in the fluorescent wavelength, the size, and the like.

The stimulation position setting section 53 is configured to individually sets, as a stimulation position, the nucleus of the specific cell of each of the observation positions, the nucleus being extracted by the image processing section 65.

The observation condition registration section 57 is configured to register, as observation conditions associated with each of the observation positions, the individual stimulation position set by the stimulation position setting section 53, together with the other conditions, such as the common synchronization condition, and the wavelength and intensity of illumination light.

The operation of the microscope system 200 configured in this way will be described.

In a case where an experiment of FRET or FRAP is performed to a plurality of samples S by the microscope system 200 according to the present embodiment, the user first acquires an image of an entire wells as shown in FIG. 3.

Then, as shown in FIG. 6, the user inputs a plurality of observation positions A to J which are included in the image of the entire wells and at which the experiment of FRET or FRAP is performed, and then images of all the observation positions A to J are generated by the image generation section 63. The inputted observation positions A to J are set by the observation position setting section 51.

Next, the common synchronization condition (the pattern 1 shown in FIG. 2(a) or the pattern 2 shown in FIG. 2(b)), which associates the timing of acquisition of image information with the timing of irradiation with stimulation light and which is assumed in the experiment of FRET or FRAP, is set by the synchronization condition setting section 55.

Then, the image of each of the observation positions A to J, which image is generated by the image generation section 63, is processed by the image processing section 65, so that, for each of the observation positions A to J, the nucleus of a specific cell is extracted on the basis of the difference in the fluorescent wavelength, the shape, and the like.

Subsequently, the nucleus of the specific cell in each of the observation positions A to J, which nucleus is extracted by the image processing section 65, is individually set as a stimulation position by the stimulation position setting section 53. Then, by the observation condition registration section 57, the individual stimulation position set by the stimulation position setting section 53, and the common synchronization condition set by the synchronization condition setting section 55 are registered as observation conditions together with the other conditions, so as to be associated with each of the observation positions A to J. With the above-described operations, the preparation work is completed.

Subsequently, similarly to the first embodiment, the experiment of FRAP or FRET is performed in such a manner that the observation positions and the observation conditions which are registered in the observation condition registration section 57 are read by the control section 61, and that, while the observation positions A to J are switched by moving the stage 1, the observation optical system 5 and the stimulation optical system 9 are controlled according to the observation conditions of each of the observation positions A to J, and thereby the image acquisition and the optical stimulation are performed to the sample S in each of the observation positions A to J.

As described above, the microscope system 200 according to the present embodiment is configured such that the image acquired by the image generation section 57 is processed by the image processing section 65 to extract the nucleus (feature) of a specific cell in each of a plurality of observation positions, and such that, on the basis of the extracted nucleus of the specific cell in each of the observation positions, a stimulation position is individually set for each of the observation positions by stimulation position setting section 53. Therefore, when the user performs only the preparation work of making the plurality of observation positions set by the observation position setting section 51, and making the synchronization condition set by the synchronization condition setting section 55, then the acquisition of image information and the optical stimulation of the stimulation position can be automatically performed for each of the observation positions. Thereby, the same experiment of the observation and optical stimulation can be performed for the plurality of samples S for each of the observation positions A to J in a state in which the labor of the user is significantly reduced.

Figure 11:
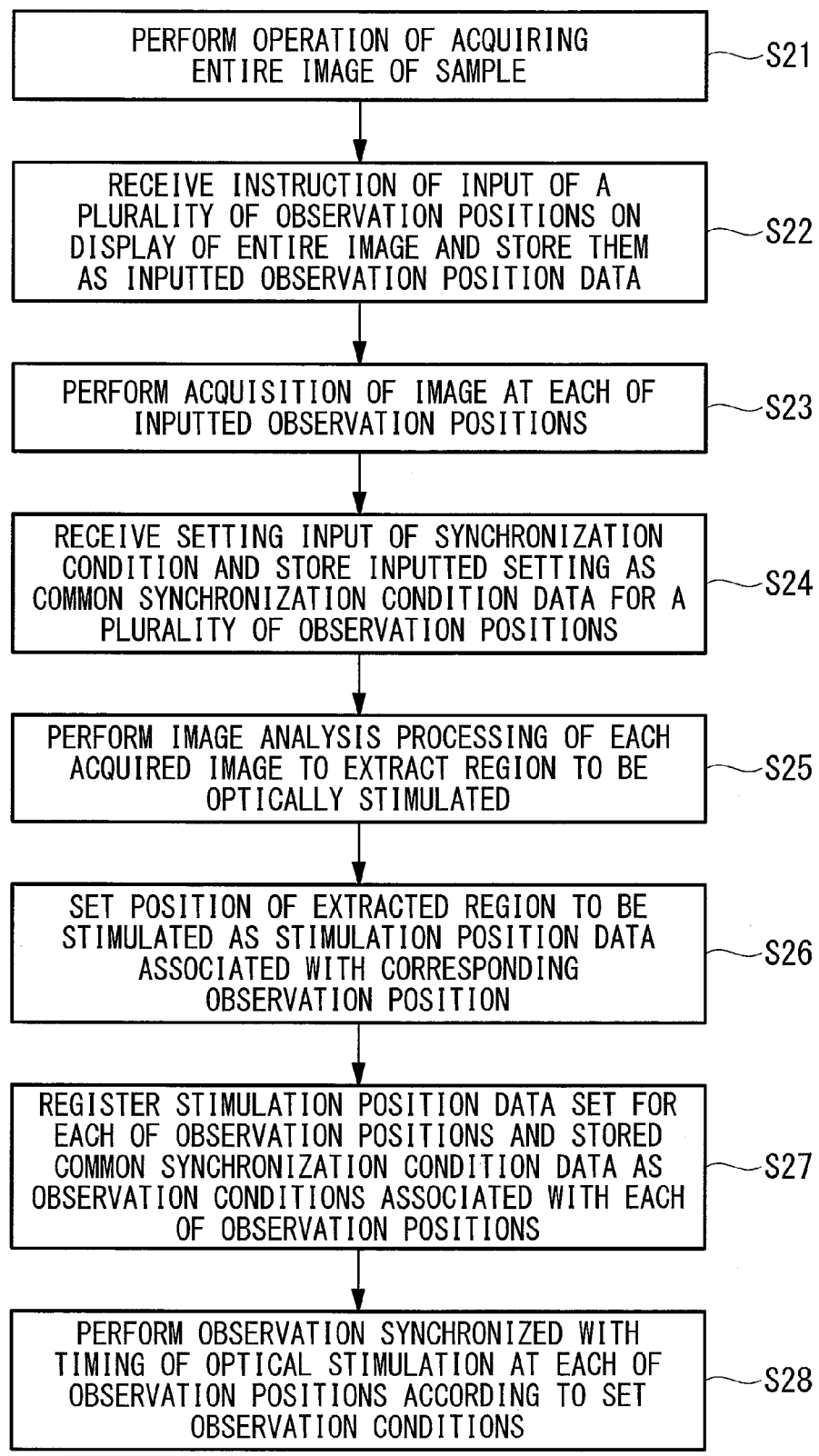
FIG. 11 is a flow chart for explaining the operation of the PC shown in FIG. 7.

FIG. 11 is a flow chart showing the operation of the PC 13 in experiments of FRET or FRAP according to the second embodiment. Step 22 corresponds to the actual operation when the PC 13 functions as the observation position setting section. Step 24 corresponds to the actual operation when the PC 13 functions as the synchronization condition setting section. Step 25 corresponds to the actual operation when the PC 13 functions as the image information processing section. Step 26 corresponds to the actual operation when the PC 13 functions as the stimulation position setting section. Step 27 corresponds to the actual operation when the PC 13 functions as the observation condition registration section. Step 28 corresponds to the actual operation when the PC 13 functions as the control section.

Third Embodiment

Next, a microscope system according to a third embodiment of the present invention will be described.

Figure 8:
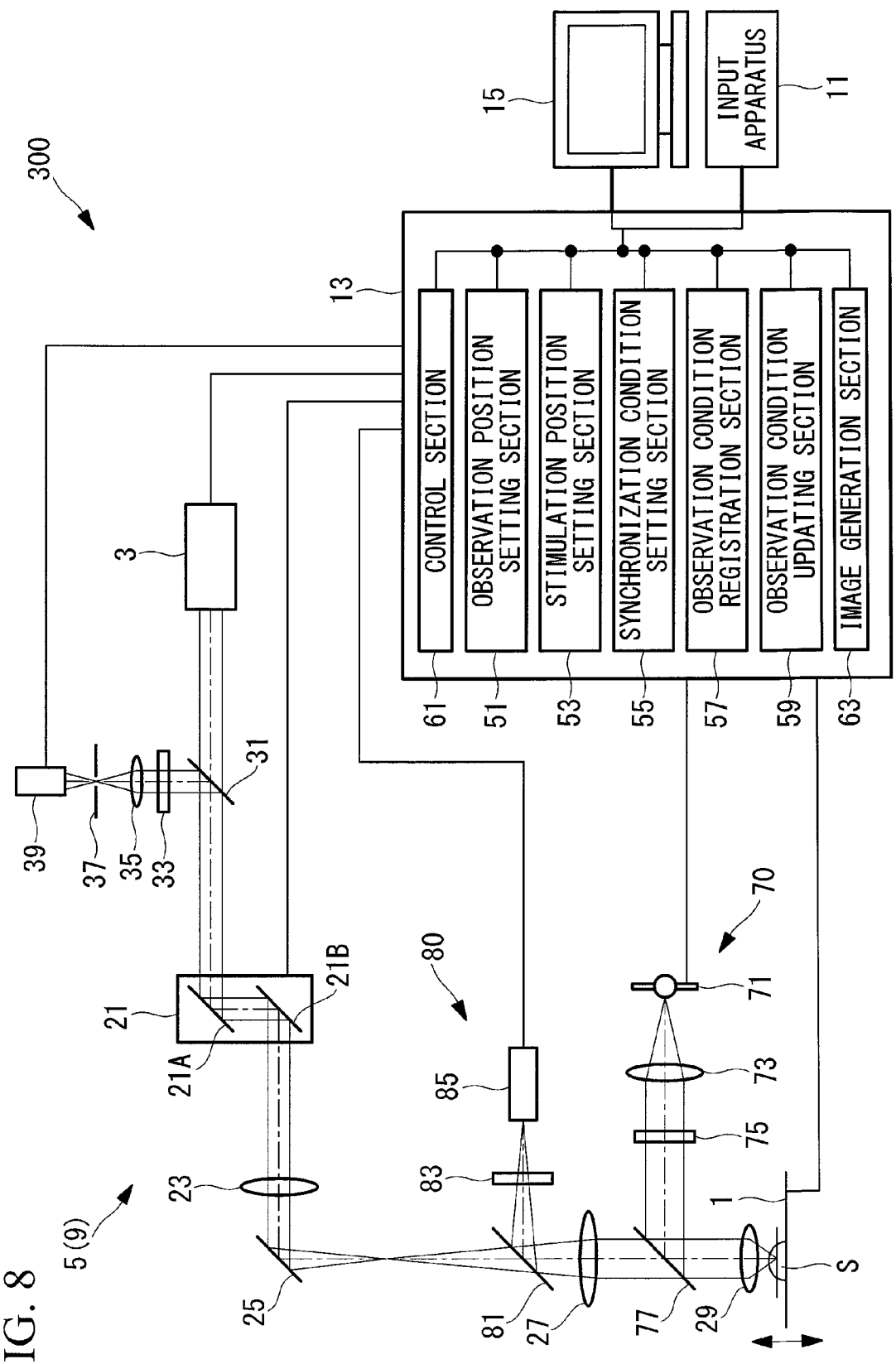
FIG. 8 is a view showing a schematic configuration of a microscope system according to a third embodiment of the present invention.

As shown in FIG. 8, a microscope system 300 according to the present embodiment is different from the first embodiment in that the observation optical system 5 and the stimulation optical system 9 are configured as one common optical system.

In the following, the portions, which configure the microscope system 300, and which are in common with the portions configuring the microscope system 100 according to the first embodiment, are denoted by the same reference numerals and characters, and the description thereof is omitted.

The microscope system 300 according to the present embodiment is configured such that, when the observation optical system 5 is used as the stimulation optical system 9, the illumination light emitted from the observation light source 3 is used as stimulation light and is scanned on the sample S by the scanning optical unit 21 so as to be applied to a stimulation position.

The present embodiment is configured such that the synchronization condition setting section 55 sets, as a synchronization condition, for example, a pattern as shown in FIG. 9 in which XYT images are acquired for several rates by using one scanning optical unit 21 as the observation optical system 5, and in which the sample is then irradiated with stimulation light (subjected to optical stimulation) by the one scanning optical unit 21 as the stimulation optical system 9, and then XYT images are again acquired for several rates by using the one scanning optical unit 21 as the observation optical system 5.

Further, the microscope system 300 includes an illumination optical system 70 which illuminates the entire sample S, and a detection optical system 80 which detects the return light from the sample S irradiated with the illumination light by the illumination optical system 70.

The illumination optical system 70 includes a light source 71 which generates illumination light, a relay lens 73 which relays the illumination light emitted from the light source 71, an excitation filter 75 which extracts light of a wavelength required to excite a fluorescent material of the sample S from the illumination light relayed by the relay lens 73, and a dichroic mirror 77 which combines the optical path of the illumination light passing through the excitation filter 75 with the common optical path of the observation optical system 5 and the stimulation optical system 9.

The detection optical system 80 includes a dichroic mirror 81 which branches, from the optical path of the laser light, the return light condensed by the objective lens 29 and returning via a dichroic mirror 77 and an imaging lens 27, a photometry filter 83 which selectively transmits only light of a fluorescent wavelength included in the return light whose optical path is branched by the dichroic mirror 81, and an imaging element 85, such as CCD (Charge Coupled Device), which acquires an image of the sample S by photographing the fluorescence transmitted through the photometry filter 83.

The operation of the microscope system 300 configured in this way will be described.

In the microscope system 300 according to the present embodiment, the case where an image of the sample S is acquired by the observation optical system 5 is the same as in the first embodiment, and hence the description thereof is omitted. On the other hand, in the case where the sample S is optically stimulated, the observation optical system 5 is also used as the stimulation optical system 9, and stimulation light is generated from the observation light source 3, so as to be applied to the sample S by the objective lens 29 via the scanning optical unit 21.

Next, when an experiment of FRET or FRAP is performed to a plurality of the samples S, the observation and the optical stimulation are performed in such a manner that a common synchronization condition (the pattern shown in FIG. 9), which associates the timing of acquisition of image information with the timing of irradiation with stimulation light and which is assumed in the experiment of FRET or FRAP, is set by the synchronization condition setting section 55, and that the synchronization condition is associated, as the observation condition, with each of the observation positions together with the common stimulation position, and the like.

In the microscope system 300 according to the present embodiment as described above, the same effects as those of the first embodiment is acquired with the configuration in which the observation optical system 5 and the stimulation optical system 9 are combined into one common optical system.

In the present embodiment, the case where the observation optical system 5 and the stimulation optical system 9 of the first embodiment are combined into one common optical system is exemplified and described, but similarly, the observation optical system 5 and the stimulation optical system 9 of the second embodiment may be combined into one common optical system. Also, in this case, the same effects as those of the second embodiment can be obtained.

Each of the above-described embodiments can be modified as follows.

In each of the above-described embodiments, the stage 1 serving as the observation position switching section is exemplified and described. However, instead of this, a microscope stage (not shown), by which the microscope main body having the observation optical system 5, the stimulation optical system 9, and the like, is supported so as to be movable with respect to the stage 1 in the directions perpendicular to the optical axis of the objective lens 29, may also be adopted as the observation position switching section.

In this case, the observation position of the observation optical system 5 may be switched in such a manner that, instead of moving the stage 1, the microscope main body is moved by the microscope stage with respect to the stage 1, to thereby move the sample S in the XY directions with respect to the illumination light.

The microscope stage may be configured, for example, such that a fixed plate fixed on a surface plate (not shown), and two plates movable, with respect to the fixed plate, in the XY directions perpendicular to each other are provided to overlap each other in the thickness direction, and such that the microscope main body is mounted on the movable plate. In this case, it may be configured such that the stage 1 and the microscope stage are mounted on the surface plate, and also the microscope main body is mounted on the microscope stage, and such that, in the state where the stage 1 is fixed, the microscope main body is moved in the XY directions by the microscope stage.

With this configuration, the position of the objective lens 29 can be moved on the horizontal plane with respect to the stage 1 by the movement of the microscope stage. Therefore, the same operation as in each of the above-described embodiments can be realized by moving the microscope stage instead of moving the stage 1 as in each of the above-described embodiments.

As described above, the embodiments according to the present invention have been described in detail with reference to the accompanying drawings. However, specific configurations of the present invention are not limited to the embodiments, and design changes, and the like, within the scope and spirit of the present invention are included in the present invention. For example, the present invention is not limited to those obtained by modifying the embodiments and modifications described above, and may also be applied to the embodiment obtained by suitably combining the embodiments and the modifications. Therefore, the present invention is not limited in particular.

From the above-described embodiments, the following inventions are derived.

A first aspect of the present invention is a microscope system including: an observation optical system that acquires image information at an observation position of a sample; a stimulation optical system that irradiates the sample with stimulation light; an observation position setting section that sets a plurality of the observation positions; a stimulation position setting section that sets a common stimulation position which is irradiated with stimulation light in association with the observation position; an observation position switching section that switches the plurality of the observation positions set by the observation position setting section; a synchronization condition setting section that sets a common synchronization condition in which the timing of acquisition of image information by the observation optical system is associated with the timing of irradiation with the stimulation light by the stimulation optical system; an observation condition registration section that registers the common stimulation position and the common synchronization condition as observation conditions associated with each of the plurality of the observation positions; and a control section that, according to the observation conditions registered in the observation condition registration section, makes the observation position switching section switch the observation positions, makes the observation optical system acquire image information of each of the observation positions, and makes the stimulation optical system irradiate each of the stimulation positions with stimulation light.

In this configuration, when a plurality of observation positions of samples are set by the observation position setting section, a common stimulation position which is set by the stimulation position setting section in association with the observation positions, and a common synchronization condition, which is set by the synchronization condition setting section, and in which the timing of image information acquisition by the observation optical system is associated with the timing of optical stimulation by the stimulation optical system, are registered as observation conditions associated with each of the plurality of observation positions.

Further, after the user performs preparation work of setting the common stimulation position and the common synchronization condition, the control section can automatically perform the acquisition of image information for each of the observation positions, and the optical stimulation at the stimulation position in each of the observation positions in such a manner that, while the observation position is switched by the observation position switching section, image information at each of the observation positions is acquired by the observation optical system according to the observation conditions registered in the observation condition registration section, and that each of the stimulation positions is irradiated with stimulation light by the stimulation optical system. Therefore, the same experiment by the observation and optical stimulation can be performed for the respective samples for each of the observation positions in a state in which the labor of the user is reduced. Each of the observation position and stimulation position may be a point having almost no area, or may be a region having an area.

In the first aspect, the observation position setting section may be configured to set each of the observation positions so that the common stimulation position is set to a desired position in each of the observation positions.

In this configuration, at the same time when the plurality of observation positions are set, a stimulation position is arranged at a desired position of the sample in each of the observation positions by the observation position setting section. Thereby, a desired stimulation position can be set at once in each of the observation positions by the stimulation position setting section. Therefore, it is possible to eliminate the labor of re-adjusting the stimulation positions once set, and it is also possible to simply and accurately perform the experiment by the observation and optical stimulation for the respective samples for each of the observation positions.

In the first aspect, the microscope system may be configured to include an observation condition updating section that updates each of the observation conditions in such a manner that the stimulation position, which is registered in association with each of the observation positions by the observation condition registration section, is adjusted to a desired position for each of the observation positions according to a user's instruction, and may be configured such that the control section controls the observation optical system and the stimulation optical system according to the observation condition for each of the observation positions, the observation conditions being updated by the observation condition updating section.

With this configuration, a plurality of observation positions can be set by the observation position setting section without regard to the arrangement of the common stimulation position. Further, the same observation and optical stimulation can be performed with sufficient accuracy for the plurality of samples for each of the observation positions according to the observation conditions updated for each of the observation positions by the observation condition updating section.

A second aspect of the present invention is a microscope system including: an observation optical system that acquires image information at an observation position of a sample; a stimulation optical system that irradiates the sample with stimulation light; an observation position setting section that sets a plurality of the observation positions; an observation position switching section that switches the plurality of the observation positions set by the observation position setting section; an image information processing section that processes the image information acquired by the observation optical system and extracts a feature of each of the observation positions; a stimulation position setting section that sets an individual stimulation position for each of the observation positions on the basis of the feature extracted by the image information processing section; a synchronization condition setting section that sets a common synchronization condition in which the timing of acquisition of image information by the observation optical system is associated with the timing of irradiation with the stimulation light by the stimulation optical system; an observation condition registration section that registers the individual stimulation position and the common synchronization condition as observation conditions associated with each of the plurality of the observation positions; and a control section that, according to the observation conditions registered in the observation condition registration section, makes the observation position switching section switch the observation positions, makes the observation optical system acquire image information of each of the observation positions, and makes the stimulation optical system irradiate each of the stimulation positions with stimulation light.

In this configuration, a stimulation position is individually set by the stimulation position setting section for each of the observation positions on the basis of the feature of each of the observation positions, which feature is extracted by the image information processing section performing processing of the image information acquired by the observation optical system. Therefore, when the user only performs preparation work of making the observation position setting section set a plurality of observation positions, and making the synchronization condition setting section set a synchronization condition, then the acquisition of image information for each of the observation positions and the optical stimulation at the stimulation position can be automatically performed. Thereby, it is possible to significantly reduce the labor of the user, and to simply and efficiently perform the same experiments by observation and optical stimulation for the plurality of samples for each of the observation positions. Each of the observation position and stimulation position may be a point having almost no area, or may be a region having an area.

A third aspect of the present invention is a microscope system including: a stage on which a sample is mounted; an observation optical system that irradiates the sample mounted on the stage with illumination light and acquires image information at an observation position of the sample; a stimulation optical system that irradiates the sample mounted on the stage with stimulation light; and a computer that is connected to the stage, the observation optical system, and the stimulation optical system, and controls the stage, the observation optical system, and the stimulation optical system, wherein the stage is configured to be movable in the directions perpendicular to the optical axes of the illumination light and the stimulation light, and the computer includes: an observation position setting section that sets a plurality of the observation positions; a stimulation position setting section that sets a common stimulation position which is irradiated with stimulation light in association with the observation position; a synchronization condition setting section that sets a common synchronization condition in which the timing of acquisition of image information by the observation optical system is associated with the timing of irradiation with the stimulation light by the stimulation optical system; an observation condition registration section that registers the common stimulation position and the common synchronization condition as observation conditions associated with each of the plurality of the observation positions; and a control section that, according to the observation conditions registered in the observation condition registration section, switches, by moving the stage, the plurality of the observation positions set by the observation position setting section, makes the observation optical system acquire image information at each of the observation positions, and makes the stimulation optical system irradiate each of the stimulation positions with stimulation light.

A fourth aspect of the present invention is a microscope system including: a stage on which a sample is mounted; an observation optical system that irradiates the sample mounted on the stage with illumination light and acquires image information at an observation position of the sample; a stimulation optical system that irradiates the sample mounted on the stage with stimulation light; and a computer that is connected to the stage, the observation optical system, and the stimulation optical system, and controls the stage, the observation optical system, and the stimulation optical system, wherein the stage is configured to be movable in the directions perpendicular to the optical axes of the illumination light and the stimulation light, and the computer includes: an observation position setting section that sets a plurality of observation positions; an image information processing section that processes the image information acquired by the observation optical system and extracts a feature of each of the observation positions; a stimulation position setting section that sets an individual stimulation position for each of the observation positions on the basis of the feature extracted by the image information processing section; a synchronization condition setting section that sets a common synchronization condition in which the timing of acquisition of image information by the observation optical system is associated with the timing of irradiation with the stimulation light by the stimulation optical system; an observation condition registration section that registers the individual stimulation position and the common synchronization condition as observation conditions associated with each of the plurality of the observation positions; and a control section, according to the observation conditions registered in the observation condition registration section, that switches, by moving the stage, the plurality of the observation positions set by the observation position setting section, makes the observation optical system acquire image information at each of the observation positions, and makes the stimulation optical system irradiate each of the stimulation positions with stimulation light.

REFERENCE SIGNS LIST

1 Stage (Observation position switching section)
5 Observation optical system
9 Stimulation optical system
51 Observation position setting section
53 Stimulation position setting section
55 Synchronization condition setting section
57 Observation condition registration section
59 Observation condition updating section
61 Control section
65 Image processing section (Image information processing section)
100, 200, 300 Microscope system

The invention claimed is:

1. A microscope system comprising:
an observation optical system that acquires image information at an observation position of a sample;
a stimulation optical system that irradiates the sample with stimulation light;
an observation position setting section that sets a plurality of the observation positions;
a stimulation position setting section that sets a common stimulation position which is irradiated with stimulation light in association with the observation position;
an observation position switching section that switches the plurality of the observation positions set by the observation position setting section;
a synchronization condition setting section that sets a common synchronization condition in which the timing of acquisition of image information by the observation optical system is associated with the timing of irradiation with the stimulation light by the stimulation optical system;
an observation condition registration section that registers the common stimulation position and the common synchronization condition as observation conditions associated with each of the plurality of the observation positions; and
a control section that, according to the observation conditions registered in the observation condition registration section, makes the observation position switching section switch the observation positions, makes the observation optical system acquire image information of each of the observation positions, and makes the stimulation optical system irradiate each of the stimulation positions with stimulation light.

2. The microscope system according to claim 1, wherein the observation position setting section sets each of the observation positions so that the common stimulation position is set to a desired position in each of the observation positions.

3. The microscope system according to claim 1, further comprising:
an observation condition updating section that updates each of the observation conditions in such a manner that the stimulation position, which is registered in association with each of the observation positions by the observation condition registration section, is adjusted to a desired position for each of the observation positions according to a user's instruction,
wherein the control section controls the observation optical system and the stimulation optical system according to the observation condition for each of the observation positions, the observation conditions being updated by the observation condition updating section.

4. The microscope system according to claim 1, wherein the observation optical system and the stimulation optical system are configured as one common optical system.

5. The microscope system according to claim 4, further comprising:
an observation condition updating section that updates each of the observation conditions in such a manner that the stimulation position, which is registered in association with each of the observation positions by the observation condition registration section, is adjusted to a desired position for each of the observation positions according to a user's instruction,
wherein the control section controls the observation optical system and the stimulation optical system according to the observation condition for each of the observation positions, the observation conditions being updated by the observation condition updating section.

6. A microscope system comprising:
an observation optical system that acquires image information at an observation position of a sample;
a stimulation optical system that irradiates the sample with stimulation light;
an observation position setting section that sets a plurality of the observation positions;
an observation position switching section that switches the plurality of the observation positions set by the observation position setting section;
an image information processing section that processes the image information acquired by the observation optical system and extracts a feature of each of the observation positions;
a stimulation position setting section that sets an individual stimulation position for each of the observation positions on the basis of the feature extracted by the image information processing section;
a synchronization condition setting section that sets a common synchronization condition in which the timing of acquisition of image information by the observation optical system is associated with the timing of irradiation with the stimulation light by the stimulation optical system;
an observation condition registration section that registers the individual stimulation position and the common synchronization condition as observation conditions associated with each of the plurality of the observation positions; and
a control section that, according to the observation conditions registered in the observation condition registration section, makes the observation position switching section switch the observation positions, makes the observation optical system acquire image information of each of the observation positions, and makes the stimulation optical system irradiate each of the stimulation positions with stimulation light.

7. The microscope system according to claim 6, wherein the observation optical system and the stimulation optical system are configured as one common optical system.

8. A microscope system comprising:
a stage on which a sample is mounted;
an observation optical system that irradiates the sample mounted on the stage with illumination light and acquires image information at an observation position of the sample;
a stimulation optical system that irradiates the sample mounted on the stage with stimulation light; and
a computer that is connected to the stage, the observation optical system, and the stimulation optical system, and controls the stage, the observation optical system, and the stimulation optical system,
wherein the stage is configured to be movable in the directions perpendicular to the optical axes of the illumination light and the stimulation light, and
the computer includes:
an observation position setting section that sets a plurality of the observation positions;
a stimulation position setting section that sets a common stimulation position which is irradiated with stimulation light in association with the observation positions;
a synchronization condition setting section that sets a common synchronization condition in which the timing of acquisition of image information by the observation optical system is associated with the timing of irradiation with the stimulation light by the stimulation optical system;
an observation condition registration section that registers the common stimulation position and the common synchronization condition as observation conditions associated with each of the plurality of the observation positions; and
a control section that, according to the observation conditions registered in the observation condition registration section, switches, by moving the stage, the plurality of the observation positions set by the observation position setting section, makes the observation optical system acquire image information of each of the observation positions, and makes the stimulation optical system irradiate each of the stimulation positions with stimulation light.

9. A microscope system comprising:
a stage on which a sample is mounted;
an observation optical system that irradiates the sample mounted on the stage with illumination light and acquires image information at an observation position of the sample;
a stimulation optical system that irradiates the sample mounted on the stage with stimulation light; and
a computer that is connected to the stage, the observation optical system, and the stimulation optical system, and controls the stage, the observation optical system, and the stimulation optical system,
wherein the stage is configured to be movable in the directions perpendicular to the optical axes of the illumination light and the stimulation light, and
the computer includes:
an observation position setting section that sets a plurality of the observation positions;
an image information processing section that processes the image information acquired by the observation optical system and extracts a feature of each of the observation positions;
a stimulation position setting section that sets an individual stimulation position for each of the observation positions on the basis of the feature extracted by the image information processing section;
a synchronization condition setting section that sets a common synchronization condition in which the timing of acquisition of image information by the observation optical system is associated with the timing of irradiation with the stimulation light by the stimulation optical system;
an observation condition registration section that registers the individual stimulation position and the common synchronization condition as observation conditions associated with each of the plurality of the observation positions; and
a control section that, according to the observation conditions registered in the observation condition registration section, switches, by moving the stage, the plurality of the observation positions set by the observation position setting section, makes the observation optical system acquire image information of each of the observation positions, and makes the stimulation optical system irradiate each of the stimulation positions with stimulation light.

* * * * *